United States Patent [19]

Matsuda et al.

[11] Patent Number: 5,075,738

[45] Date of Patent: Dec. 24, 1991

[54] SWITCHING DEVICE AND METHOD OF PREPARING IT

[75] Inventors: Hiroshi Matsuda; Kunihiro Sakai, both of Isehara; Hisaaki Kawade, Atsugi; Yuko Morikawa; Kiyoshi Takimoto, both of Kawasaki; Osamu Takamatsu, Atsugi; Haruki Kawada, Yokohama, all of Japan

[73] Assignee: Canon Kabushiki Kaisha, Tokyo, Japan

[21] Appl. No.: 329,813

[22] Filed: Mar. 28, 1989

[30] Foreign Application Priority Data

Mar. 28, 1988 [JP] Japan ................................. 63-71760
Mar. 28, 1988 [JP] Japan ................................. 63-71761

[51] Int. Cl.$^5$ ..................... H01L 49/02; H01L 27/12; H01L 29/34
[52] U.S. Cl. .......................................... 357/6; 357/4; 357/8; 357/54
[58] Field of Search ............................. 357/6, 8, 4, 54

[56] References Cited

U.S. PATENT DOCUMENTS

| | | | |
|---|---|---|---|
| 3,519,999 | 7/1970 | Gregor | 340/173 |
| 3,719,933 | 3/1973 | Wakayashi et al. | 365/148 |
| 4,534,623 | 8/1985 | Araki | 357/4 |
| 4,630,081 | 12/1986 | Calviello | 357/6 |
| 4,780,790 | 10/1988 | Takimoto et al. | 361/323 |
| 4,929,524 | 5/1990 | Sakai et al. | |

FOREIGN PATENT DOCUMENTS 62-42584 2/1987 Japan .

OTHER PUBLICATIONS

Thin Solid Films, vol. 152, Nos. 1-2, pp. 305-306, Sep. 14, 1987, Sugi. M., "Molecular Engineering In Japan-A Prospect of Research on Langmuir-Blodgett Films".
Thin Solid Films, vol. 99, 1983, pp. 277-282, Larkins, G. et al., "Langmuir-Blodgett Films as Barrier Layers in Josephson Tunnel Junctions".
Electronics Letters, vol. 29, 1984, p. 485, Batey, J. et al., "GaP/Phthalocyanine Langmuir-Blodgett Film Electroluminescent Diode".
Electronics Letters, vol. 20, 1984, p. 838, Thomas, N. et al. "GaAs/LB Film Miss Switching Device".

Primary Examiner—Andrew J. James
Assistant Examiner—Ngan Van Ngo
Attorney, Agent, or Firm—Fitzpatrick, Cella, Harper & Scinto

[57] ABSTRACT

A switching device comprises a pair of electrodes, an organic insulating layer and an inorganic oxide layer which are held between the electrodes. The organic insulating layer is comprised of an organic compound having at least one $\pi$-electron level and the inorganic oxide layer is comprised of a metal oxide. Another switching device comprises a pair of electrodes, an organic insulating thin film provided between the electrodes and said organic insulating thin film in such a manner than an electrification region between the electrodes may be restricted.

21 Claims, 2 Drawing Sheets

SWITCHING DEVICE AND METHOD OF PREPARING IT

BACKGROUND OF THE INVENTION

1. Field of the Invention

The present invention relates to a switching device with an MIM (metal-insulator-metal) structure, comprising an organic insulating layer, and a method of preparing it. More particularly it relates to a switching device greatly improved in the repetition stability of switching characteristics and the switching speed, and a method of preparing it.

2. Related Background Art

Recently, there is an increasing interest in molecular electronics in which it is attempted to apply the functionality of organic molecules to electronic devices, etc. Studies on the Langmuir-Blodgett film (LB film) which may be deemed to be one of the constructive techniques for molecular electronic devices are being actively made. The LB film is formed by laminating organic molecule layers regularly one by one, and the film thickness can be controlled at a level of molecular length. Since a uniform and homogeneous ultra-thin film can therefore be formed, it has been frequently attempted to use such a film as an insulating film. For example, there are a tunnel bonding element with metal-insulator-metal (MIM) structure [G. L. Larkins et al., "Thin Solid Films", Vol. 99 (1983)]; emission element with metal-insulator-semiconductor (MIS) structure [G. C. Roberts et al., "Electronics Letters", Vol. 29, pp. 489 (1984)]; and switching element [N. J. Thomas et al., "Electronics Letters", Vol. 20, pp. 838 (1984)].

Although device characteristics have been solved, such device have the deficiency of reproducibility and stability such as variance in characteristics for every element and change with lapse of time.

Electrodes used in the studies mentioned above have hitherto been formed by vapor deposition using a mask. In instances in which electrodes are formed by the vapor deposition using a mask, the areas and shapes of electrodes can not be freely selected, and they are necessarily limited, causing problems, e.g., in preparing integrated circuits. On the other hand, if it is possible to freely select the areas and shapes of electrodes, an improvement could be expected in device characteristics or device-driving methods.

SUMMARY OF THE INVENTION

Accordingly, an object of the present invention is to provide a novel switching device greatly improved in the repetition stability of switching characteristics and in the storage stability of devices.

Another object of the present invention is to provide a novel switching device greatly improved in the switching speed, and a method of preparing it.

The present invention provides a switching device, comprising a pair of electrodes, an organic insulating layer and an inorganic oxide layer which are held between the electrodes.

In another embodiment, the present invention provides a switching device, comprising a pair of electrodes, an organic insulating thin film provided between said electrodes, and an inorganic insulating thin film provided between one of the electrodes and the organic insulating thin film in such a manner that an electrification region between the electrodes may be restricted.

The present invention also provides a method of preparing a switching device, comprising the steps of forming an organic insulating thin film by the Langmuir-Blodgett process, and forming by lithography on said organic insulating thin film an inorganic insulating thin film in the form of a pattern.

DETAILED DESCRIPTION OF THE PREFERRED EMBODIMENTS

The studies as previously mentioned have hitherto been focused on LB (Langmuir-Blodgette) films of fatty acids, which are relatively easy to handle. Recently, however, even with respect to their thermal resistance and mechanical strength hitherto considered to be poor, organic materials having overcome these are being created one after another. In fact, with respect to the LB films in which such materials are used, the present inventors have prepared a device with the sandwich structure comprising an insulating layer held at its both sides by conductive materials such as metals (commonly called an MIM structure or MIM device in view of its constitution) to observe and measure the physical properties of materials and the characteristics including electrical characteristics, and, as a result, have already found a quite new switching phenomenon in electrical conduction.

In regard to MIM devices that exhibit such a quite new switching phenomenon, the inventors have made further detailed studies on the constitution of the above MIM device in an attempt to lessen the dispersion of its electrical characteristics or improve its stability, and, as a result, completed a switching device having a memory function with greatly superior reliability.

Figure 1:
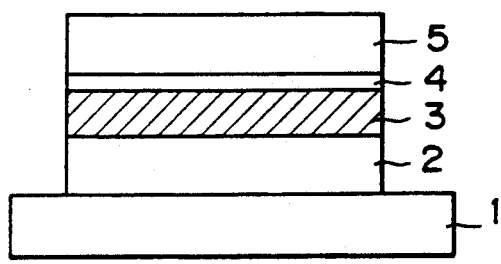
FIG. 1 is a cross-section of the switching device according to an embodiment of the present invention.

In the present invention, as shown in FIG. 1 an organic insulating thin film layer 3 containing an organic compound having at least one $\pi$-electron level, and an inorganic oxide thin film layer comprising a metal oxide or the like are laminated. In such a structural body, the present invention intends to realize that a nonlinear current-voltage characteristics which are different from those of conventionally known MIM devices are exhibited by supplying an electric current in the direction parallel to the lamination direction of the organic insulating layer and inorganic oxide layer. The present invention has also realized a novel MIM device having a switching memory function utilizing such characteristics.

A fundamental constitution of the switching device of the present invention is illustrated in FIG. 1. In the organic insulating layer 3 of the present invention, not only insulating organic compounds but also semiconductive organic compounds can be used so long as they are organic compounds having a $\pi$-electron level.

Since, in general, almost all of organic materials show insulating or semi-insulating properties, the organic materials having a $\pi$-electron level, applicable to the present invention, include a great variety of materials.

Coloring matter structures of a $\pi$-electron type suited to the present invention include, for example, coloring matters having a porphyrin structure, such as phthalocyanine and tetraphenylporphyrin; azulene dyes having a squalilium group and a croconic methine group as bonding chains; and cyanine-analogus dyes formed by combining two nitrogen-containing heterocyclic rings such as quinoline, benzothiazole and benzoxazole, with each other through a squalilium group and a croconic methine group; or cyanine dyes; condensed polycyclic aromatics such as anthracene and pyrene; derivatives of tetraquinodimethane or tetrathiafulvalene, as well as analogues thereof and charge transfer complexes thereof; and further metal complex compounds such as ferrocene and a trisbipyridine ruthenium complex. In addition to the low molecular compounds set forth above, it is also possible to use polymeric compounds having $\pi$-electrons, such as polyimide, polystyrene, polydiacetylene and polythiophene. Among these, in forming the electrodes described above according to the lithography technique described later, polyimide is particularly preferred because of its excellent thermal resistance and solvent resistance.

The polyimide includes, for example, polyimides obtained by cyclization of polyamic acids, polyamic acid salts or polyamic acid esters, and suitably used are those obtained by cyclization and imidization of a compound having the repeating unit represented by Formula (1) and having a weight-average molecular weight of 20,000 to 3,000,000.

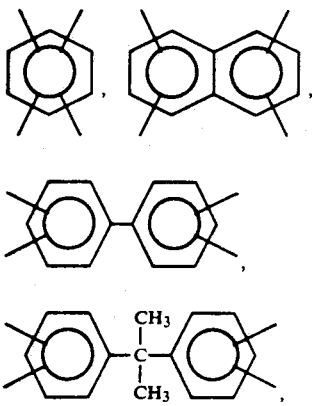

In the formula, $R_1$ represents a tetravalent group containing at least 6 carbon atoms, specifically including, for example, the following:

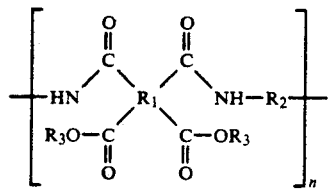

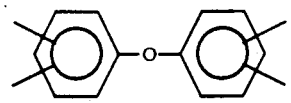

$R_2$ represents a divalent group containing at least 2 carbon atoms, specifically including, for example, the following:

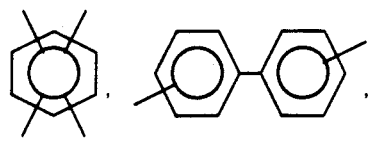

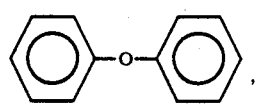

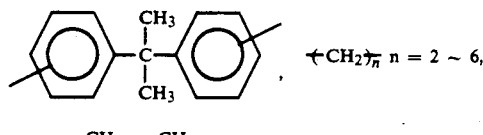

$+CH_2+_n$ n = 2 ~ 6,

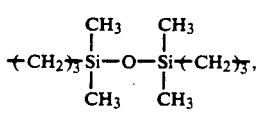

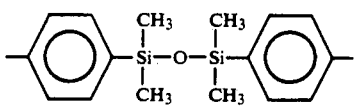

$R_3$ represents a monovalent group having at least 6 carbon atoms, or a quaternary ammonium salt having at least 6 carbon atoms, having the structure represented by Formula (2).

$CH_3(CH_2)_l-X$      Formula (2)

$l = 11$ to $21$ $X = -O-, -N^{\oplus}(CH_3)_3, -N^{\oplus}(C_2H_5)_3$

It is further possible to use the above organic materials having $\pi$-electrons, in combination with other materials. In that instance, if at least one compound has a $\pi$-electron level, the remaining compounds may not necessarily have a $\pi$-electron level, and it is also possible to use low molecular compounds such as simple fatty acids and lipids, polyacrylic acid derivatives such as polymethacrylic acid, and polymeric compounds such as nylon. Such combination of compounds is carried out mainly for the purpose of increasing stability of the organic compounds having the $\pi$-electron level, which lack structural stability. In this case, the both (i.e., the organic compound of a $\pi$-electron type and the other mixed compound) may preferably be mixed in the molar ratio ranging from 100:1 to 1:100 (in terms of monomers), and more preferably from 10:1 to 1:10 (in terms of monomers).

The organic insulating layer can be formed according to, for example, a vapor deposition process or a cluster-ion beam process. In the present invention, the organic insulating layer 3 may preferably have a thickness of not less than 3 Å to not more than 1,000 Å and more preferably not less than 50 Å not more than 300 Å, and moreover may preferably be uniform and homogeneous. As a film-forming technique that satisfies such requirements, the LB process is very suitable among conventional known techniques, from the viewpoints of the controllability, readiness, and reproducibility.

The LB process can readily form on a substrate a monomolecular film of the organic compound having a hydrophobic part and a hydrophilic part in its molecule, or a built-up film thereof, and also can stably provide an organic ultra-thin film which has a thickness of the molecular order and is uniform and homogeneous over a large area.

The LB process is a process of making a monomolecular film or a built-up film thereof by utilizing the mechanism that when the hydrophilic part and hydrophobic part are appropriately balanced (i,e, amphiphatic balance) in a molecule of the structure having the both parts therein, the molecules form a monomolecular layer by utilizing a phenomenon that hydrophilic groups are aligned downward.

The group that constitutes the hydrophobic part includes all sorts of hydrophobic groups such as saturated or unsaturated hydrocarbon groups, condensed polycyclic aromatic groups and chain polycyclic phenyl groups, which are commonly well known in the art. These constitute the hydrophobic part alone or in combination of plural ones. On the other hand, the group most typical as a component for constituting the hydrophilic part may include hydrophilic groups as exemplified by a carboxyl group, an ester group, an acid amido group, an imido group, a hydroxyl group, and further an amino group (primary, secondary, tertiary, and quaternary). These each also constitute the hydrophilic part alone or in combination of plural ones.

Coloring matter molecules having these hydrophobic part and hydrophilic part in a good balance and also having a $\pi$-electron level with an appropriate magnitude can form a monomolecular film on a water surface, and can serve as materials very suited to the present invention.

In the instance where the organic insulating layer 3 of the present invention is formed using the material comprising the mixture of two or more organic compounds, if at least the compound having the main mixing ratio has a sufficient monomolecular film forming ability, the remaining compounds may have a poor or no monomolecular film forming ability, as previously described. However, from the viewpoint of the stability of the devices finally obtained, all the materials mixed should have the monomolecular film forming ability whether they can form films with ease or difficulty.

An inorganic oxide layer 4 is laminated on the organic insulating film 3 thus formed. In the present invention, the above organic insulating layer 3 and inorganic oxide layer 4 are hereinafter paired to be referred to as "the insulating layer" for simplification.

Inorganic oxides used in the inorganic oxide layer 4 of the present invention may be any of those having insulating or semi-insulating properties, and there can be used, for example, $Al_2O_3$, BaO, BeO, MgO, $SiO_2$, CuO, PbO, $Fe_2O_3$, $Cu_2O$, $V_2O_5$, $Ta_2O_5$, $TiO_2$, $WO_3$, $Ag_2O$ and $PbTiO_3$.

As methods for forming the inorganic oxide layer comprising any of these, ordinary vacuum deposition or sputtering can be used. In the instance where the layer is formed by vacuum deposition, it is relatively difficult to directly deposit the oxides, and a metal film may first be formed by deposition followed by a procedure such as air oxidation or anodic oxidation to give an oxide film. In particular, since in the present invention the inorganic oxide layer has a thickness of not less than several Å to not more than 200 Å, and preferably not less than several Å to not more than 50 Å, a metal-deposited film may be subjected to air oxidation (or natural oxidation) to obtain the desired inorganic oxide layer with great ease. On the other hand, in the instance where the oxide layer is formed by sputtering, a metal layer may be first provided as mentioned above, followed by oxidation to obtain the desired inorganic oxide layer, but, as another method, active sputtering may be carried out in a rare gas containing oxygen, so that the inorganic oxide layer can be directly obtained with ease. Methods other than these can also be utilized so long as they are methods fundamentally capable of forming inorganic oxide layers with a film thickness of not more than 200 Å. However, since the inorganic oxide layer is formed on the organic insulating layer previously described, it is preferable to employ methods by which the underlying organic materials may be damaged as little as possible. From such a viewpoint, it is preferable in general to employ the procedure such as air oxidation of the metal-deposited film.

The insulating layer of the present invention is prepared in the manner as described above, where the electrodes 2 and 5, between which such an insulating layer is held, may be any of those having a high conductivity, which include, for example, a number of materials including metals such as Au, Pt, Ag, Pd, Al, In, Sn and Pb, or alloys of these, also graphite or silicide, and also conductive oxides such as ITO. These are expected to be applicable in the present invention. As methods of forming the electrodes that employs such materials, conventionally known thin film techniques may suffice for the purpose. However, in either electrode, it is preferred to use conductive materials that may not form any oxides having insulating properties, as exemplified by noble metals and oxide conductive materials such as ITO.

Figure 2:
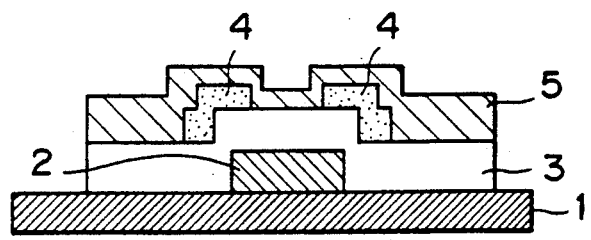
FIG. 2 illustrates another embodiment of the present invention.

FIG. 2 illustrates another embodiment of the switching device of the present invention, where the inorganic oxide layer is provided at a step portion on the electrode for the purpose of stabilizing and improving the device characteristics.

In the switching device illustrated in FIG. 2, the electrodes can be formed using a lithographic technique. Hitherto known techniques such as lift-off process and photoetching process are satisfactory for such a lithographic technique. Also, the electrodes can be formed with a width ranging from 10 $\mu$m to 1 mm. Since it is possible in the present invention to form the electrodes according to the lithographic techniques, the switching speed can be made higher.

Such lithographic techniques can also be applied to the formation of the inorganic insulating layer. Such an inorganic insulating layer may have a film thickness of from 500 Å to 1 $\mu$m, and preferably from 1,000 Å to 3,000 Å.

Methods of forming the inorganic oxide layer may not be limited to the vacuum deposition or sputtering so long as they are methods which damage with great difficulty the above-described organic insulating layer.

In regard to also the formation of electrodes, any film forming methods, capable of forming uniform thin films, can be used and the methods may not be limited to the vacuum deposition or sputtering.

Moreover, the present invention requires no particular limitations on the materials of substrates or the form thereof.

EXAMPLES

The present invention will be described below in more detail by referring to Examples.

EXAMPLE 1

On a glass substrate 1 (#7059, produced by Corning Co.,) having been subjected to hydrophobic treatment by allowing it to stand for 24 hours in a saturated vapor of hexamethyldisilazane (HMDS), Cr was deposited as a underlayer by vacuum deposition with a thickness of 30 Å, and Au was further vapor-deposited by the same process (film thickness: 300 Å), to form a lower electrode 2 in a stripe with a width of 1 mm. On the resulting substrate made to serve as a carrier, monomolecular films comprising squalilium bis-6-octylazulene (SOAZ) were built up according to the LB process, the build-up procedures of which are detailed below.

A benzene solution in which SOAZ was dissolved in a concentration of 0.2 mg/ml was spread on an aqueous phase of 20° C. of water temperature to form a monomolecular film on the water surface. After removal of the solvent by evaporation, the surface pressure of the monomolecular film thus formed was raised up to 20 mN/m. While keeping constant the surface pressure, the above substrate was gently put in water at a rate of 5 mm/min in the direction traversing the water surface, and thereafter subsequently gently drawn up at a rate of 5 mm/min, thus building up a two-layer Y-type monomolecular film. Such operations were repeated appropriate times to form four kinds of built-up films with 4, 8, 12 or 20 layers on the above substrate, thus providing an organic insulating layer 3.

Next, on the surface of the film surface thus formed, Al was vapor-deposited with a thickness of 50 Å in a stripe with a width of 1 mm in such a manner that it may cross at right angle with the lower electrode 2, and thereafter oxygen gas was fed in the vacuum chamber to oxidize the resulting Al-deposited film, thus forming an inorganic oxide layer ($Al_2O_3$ film) 4. Then, the inside of the chamber was restored again to vacuum ($4 \times 10^{-6}$ Torr or less), and an Au upper electrode 5 (film thickness: 300 Å) was formed on the above $Al_2O_3$ film.

Figure 3:
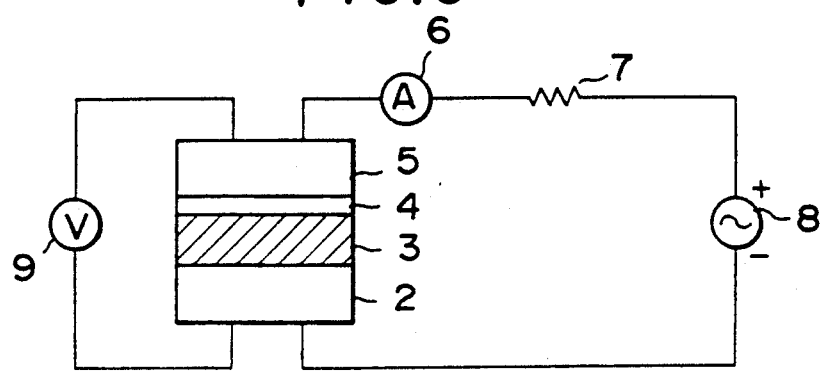
FIG. 3 illustrates a measuring circuit used for measuring electrical characteristics of the switching device of the present invention.
Figure 4:
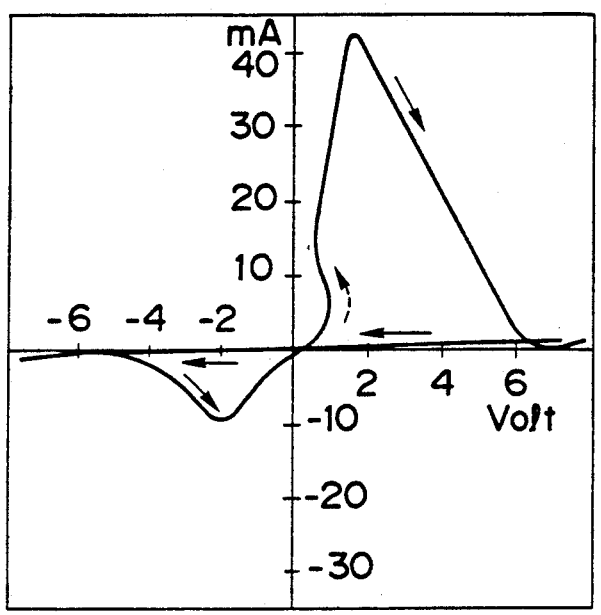
FIG. 4 is a characteristic diagram to show electrical characteristics (V/I characteristics) of the switching device of the present invention.

Using an electric circuit as illustrated in FIG. 3 (in which the numeral 6 denotes an ammeter; 7, a limiting resistor; 8, an input electric source; and 9, a voltmeter), a voltage was applied to between a pair of the upper and lower electrodes of the samples (MIM devices) thus prepared, having the MIM structure, and the current characteristics (VI characteristics) thereby produced was measured to find that the memory-functional switching characteristics as shown in FIG. 4 were obtained.

Figure 5:
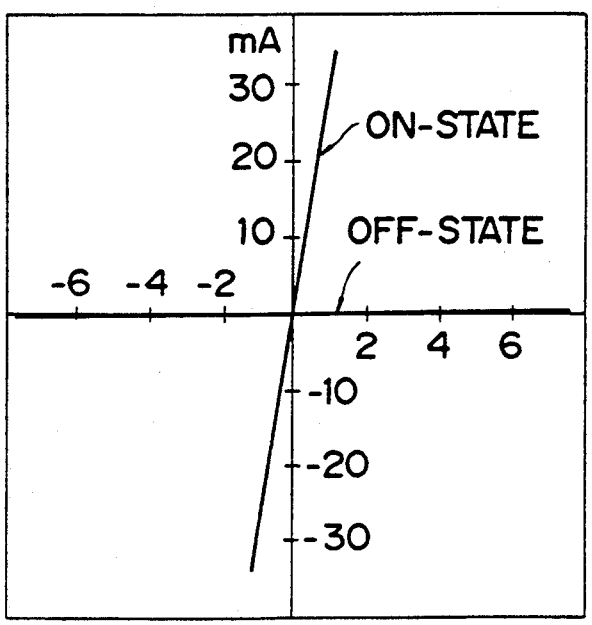
FIG. 5 shows electrical characteristics in the on state and off state, confirmed in the switching device of the present invention.

It was further possible to produce a stable on-state (resistance value: several ten $\Omega$) and off-state (resistance value: not less than M ($10^6$ order) $\Omega$) as shown in FIG. 5, where the on-to-off switching showed a constant threshold voltage (about 1 to 2 V/20 layers), the off-to-on switching occurred at about $-2$ to 2 V, and the switching speed was not more than 1 μsec with an on/off ratio (ratio of resistance value in the on-state and off-state) of not less than 5 figures.

The 4-layer samples, however, showed somewhat unstable switching characteristics, and the 20-layer samples showed that the off-to-on switching occurred with difficulty.

Triangular waves with a peak value of ±8 V and a alternating electric field frequency of 2 Hz were continuously applied to the 12-layer samples, which showed best switching characteristics, to measure the repeated switching times to find that the switching was repeated at least $10^7$ times, during which a stable reproducibility was seen in the current-voltage characteristics, and moreover no change, e.g., damage was seen in the samples themselves. These 12-layer samples were further maintained for 6 months under conditions of 25° C. and 70% RH and then switching was performed. As a result, no significant difference in the current-voltage characteristics was seen when compared with the samples on which the switching was performed immediately after the preparation of the samples. The repeated switching times were also measured to find that the switching was also repeated $10^7$ times or more with superior stability and reproducibility.

On the other hand, samples in which the inorganic oxide layer 4 comprising $Al_2O_3$ was not laminated on the organic insulating layer 3 formed of the SOAZ 12-layer LB film, and the Au upper electrode 5 (film thickness: 300 Å) was directly formed thereon, showed somewhat unstable switching characteristics, with greater dispersion thereof between samples. The repeated switching times were also measured to find that the destruction of the devices was observed in about $10^4$ times even at maximum.

Next, samples were prepared in which the inorganic oxide layer 4 was also omitted and an Au upper electrode 5 (film thickness: 1,000 Å) was directly formed on the SOAZ 12-layer LB film, to evaluate their switching characteristics. As a result, no significant difference in the current-voltage characteristics immediately after the preparation of the sample was seen when compared with the above-mentioned samples having the inorganic oxide layer 4 comprising $Al_2O_3$, but the repeated switching times were about $7 \times 10^5$ times, at which the destruction of the devices was observed. These samples were further stored under conditions of 25° C. and 70% RH and thereafter the switching characteristics was measured, where a number of samples were observed in which the off-to-on switching had become difficult to occur at the time of about 3 months lapsed.

It was seen from the above that in the MIM device having the structure that the organic compound is held between electrodes, its switching characteristics can be remarkably improved from the viewpoints of reproducibility and stability when the inorganic oxide layer comprising the inorganic oxide is provided on the organic insulating layer comprising such an organic compound.

EXAMPLE 2

MIM devices were fabricated in entirely the same manner as Example 1 except that the compound used in the organic insulating layer 3 was replaced with a mixture of SOAZ and cadmium arachidate (hereinafter "$C_{20}$"). Samples having SOAZ:$C_{20}$ mixing ratios of 4:1, 2:1, 1:1, 1:2 and 1:4 were prepared.

Procedures of forming the SOAZ-$C_{20}$ mixed insulating layer according to the LB process are detailed below.

A benzene solution in which SOAZ was dissolved in a concentration of 0.2 mg/ml and a benzene solution in which $C_{20}$ was dissolved in a concentration of 0.5 mg/ml were appropriately mixed so as to give the desired mixing ratio (molar ratio) of SOAZ to $C_{20}$, and thereafter the resulting mixed solution was spread on an aqueous phase comprising an aqueous cadmium chloride solution (water temperature: 20° C.) with a concentration of $5 \times 10^{-4}$ mol/l, adjusted to pH 6.7 using $KHCO_3$, to form a SOAZ-$C_{20}$ mixed monomolecular film on the water surface. After removal of the solvent by evaporation, the surface pressure of the monomolecular film thus formed was raised up to 20 mN/m. While keeping constant the surface pressure, a substrate provided with the lower electrode 2 (Cr/Au), prepared in the same manner as Example 1, was gently put in water at a rate of 5 mm/min in the direction traversing the water surface, and thereafter subsequently gently drawn up at a rate of 5 mm/min, thus building up a two-layer Y-type mixed monomolecular film. Such operations were repeated several times to form a 12-layer mixed built-up film, thus providing the organic insulating layer 3.

On the MIM devices thus prepared, the switching characteristics were measured in the same manner as Example 1. As a result, the same switching characteristics as Example 1 were obtained in all the samples. The repeated switching times were $10^7$ times or more for all samples. The samples were further stored for 6 months under conditions of 25° C. and 70% RH, and thereafter after which no changes were seen in the above switching characteristics.

EXAMPLE 3

MIM devices were fabricated in entirely the same manner as Example 1 except that the compound used in the organic insulating layer 3 was replaced with a mixture of SOAZ and polymethyl methacrylate (hereinafter "PMMA"). Samples having SOAZ:PMMA mixing ratios of 1:1, 1:2, 1:4 and 1:10 (molar ratios in terms of monomers) were prepared here.

Procedures of forming the SOAZ-PMMA mixed insulating layer according to the LB process are detailed below.

A benzene solution in which SOAZ was dissolved in a concentration of 0.2 mg/ml and a solution obtained by dissolving PMMA (produced by of Polyscience Co.; syndiotactic; molecular weight: 100,000) in a mixed solution of trichloroethane:benzene = 1:9 (V/V) in a concentration of 0.2 mg/ml, were appropriately mixed so as to give the desired mixing ratio, and thereafter the resulting mixed solution was spread on pure water of 20° C. in water temperature to form an SOAZ-PMMA mixed monomolecular film on the water surface. After removal of the solvent by evaporation, the surface pressure of the monomolecular film thus formed was raised up to 20 mN/m. While keeping constant the surface pressure, a substrate provided with the lower electrode 2 (Cr/Au), prepared in the same manner as Example 1, was gently put in water at a rate of 5 mm/min in the direction traversing the water surface, and thereafter subsequently gently drawn up at a rate of 5 mm/min, thus building up a two-layer Y-type mixed monomolecular film. Such operations were repeated several times to form a 12-layer mixed built-up film, thus providing the organic insulating layer 3.

On the MIM devices thus prepared, the switching characteristics were measured in the same manner as Example 1. As a result, the same switching characteristics as Example 1 were obtained in all the samples. The repeated switching times were $10^7$ times or more for all samples. The samples were further stored for 6 months under conditions of 25° C. and 70% RH, and thereafter which no changes were seen in the above switching characteristics.

EXAMPLE 4

MIM devices were fabricated in entirely the same manner as Example 1 except that the compound used in the organic insulating layer 3 was replaced with a mixture of SOAZ and polyisobutyl methacrylate (hereinafter "PIBM"). Samples having SOAZ:PIBM mixing ratios of 1:1, 1:2, 1:4 and 1:10 (molar ratios in terms of monomers) were prepared here.

Procedures of forming the SOAZ-PIBM mixed insulating layer according to the LB process are detailed below.

A benzene solution in which SOAZ was dissolved in a concentration of 0.2 mg/ml and a solution obtained by dissolving PIBM (Elvacite 2045; produced by DuPont Co.) in a mixed solution of trichloroethane:benzene = 1:9 (V/V) in a concentration of 0.2 mg/ml, were appropriately mixed so as to give the desired mixing ratio, and thereafter the resulting mixed solution was spread on pure water of 20° C. in water temperature to form an SOAZ-PIBM mixed monomolecular film on the water surface. After removal of the solvent by evaporation, the surface pressure of the monomolecular film thus formed was raised up to 10 mN/m. While keeping constant the surface pressure, a substrate provided with the lower electrode 2 (Cr/Au), prepared in the same manner as Example 1, was gently put in water at a rate of 20 mm/min in the direction traversing the water surface, and thereafter subsequently gently drawn up at a rate of 20 mm/min, thus building up a two-layer Y-type mixed monomolecular film. Such operations were repeated several times to form a 16-layer mixed built-up film, thus providing the organic insulating layer 3.

On the MIM devices thus prepared, the switching characteristics were measured in the same manner as Example 1. As a result, the same switching characteristics as Example 1 were obtained in all the samples. The repeated switching times were $10^7$ times or more for all samples. The samples were further stored for 6 months under conditions of 25° C. and 70% RH, and thereafter which no changes were seen in the above switching characteristics.

EXAMPLE 5

MIM devices were fabricated in entirely the same manner as Example 1 except that the organic insulating layer 3 was replaced with a polyimide-LB film. Procedures of forming the polyimide-LB film according to the LB process are detailed below.

Polyamide acid represented by the formula (1) was dissolved in an N,N'-dimethylacetamide solvent (at a concentration calculated as monomer: $1 \times 10^{-3}$M), and thereafter the solution was mixed with a separately prepared $1 \times 10^{-3}$M solution of N,N'-dimethyloctadecylamine using the same solvent, in the ratio of 1:2 (V/V), to prepare a solution of a polyamide acid octadecylamine salt represented by the formula (2).

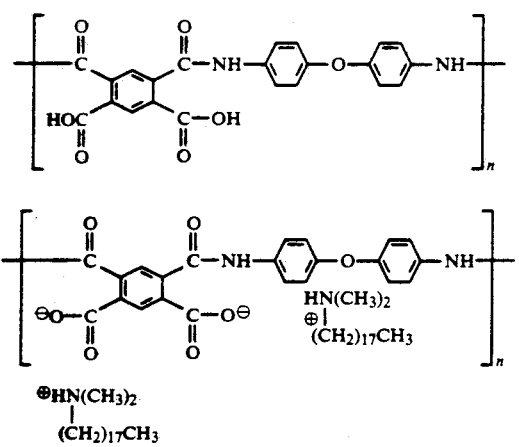

The solution thus prepared was spread on pure water of 20° C. of water temperature, and a 20-layer monomolecular built-up film of the polyamide acid octadecylamine salt was formed on a substrate provided with the lower electrode 2 as described in Example 1. In this occasion, the surface pressure was 25 mN/m., and the substrate was put in and drawn up at a rate of 5 mm/min. Next, this substrate was baked at 300° C. for 30 minutes to form the polyamide acid octadecylamine salt into an imide [formula (3)], and a 20-layer polyamide monomolecular built-up film was formed,

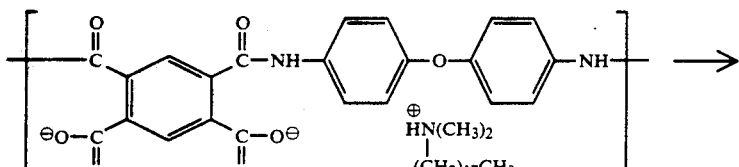 →

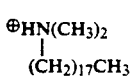

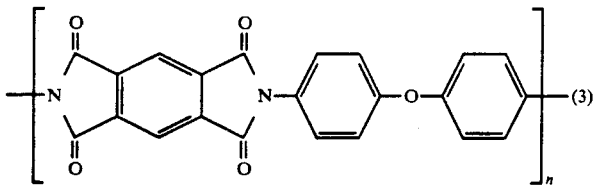

thus providing the organic insulating layer 3.

On the MIM devices thus prepared, the switching characteristics were measured in the same manner as Example 1. As a result, the same switching characteristics as Example 1 were obtained in all the samples. The repeated switching times were $10^7$ times or more for all samples. The samples were further stored for 6 months under conditions of 25° C. and 70% RH, and even no changes were seen in the above switching characteristics.

EXAMPLE 6

In the same manner as Example 5, a polyimide monomolecular built-up film was formed with 20-layer build-up on a substrate provided with the lower electrode (Cr/Au) 2, to form the organic insulating layer 3.

Next, on the surface of the film surface thus formed, Ag was deposited by sputtering in a stripe with a width of 1 mm in such a manner that it may cross at right angle with the lower electrode 2, to form an inorganic oxide layer 4 comprising $Ag_2O$ (film thickness: 30 Å).

Next, an Au upper electrode 5 (film thickness: 300 Å) was formed on the $Ag_2O$ layer according to a conventional vacuum deposition method.

On the MIM devices thus prepared, the switching characteristics were measured in the same manner as Example 1. As a result, the same switching characteristics as Example 1 were obtained in all the samples. The repeated switching times were $10^7$ times or more for all samples. The samples were further stored for 6 months under conditions of 25° C. and 70% RH, and even thereafter no changes were seen in the above switching characteristics.

EXAMPLE 7

MIM devices were fabricated in entirely the same manner as Example 1 except that the inorganic oxide layer 4 was formed with MgO. The MgO layer was obtained by depositing Mg with a thickness of 40 Å according to a conventional vacuum deposition method, followed by air oxidation. On the MIM devices thus prepared, the switching characteristics were measured in the same manner as Example 1. As a result, the same switching characteristics as Example 1 were obtained for all the samples. The repeated switching times were 107 times or more in all samples. The samples were further stored for 6 months under conditions of 25° C. and 70% RH, and thereafter which no changes were seen in the above switching characteristics.

In the above-described Examples, the LB process has been used in forming the insulating layers, but any film formation processes can be used without limitation to the LB process, so long as they can make a very thin, uniform insulating thin film. They specifically include vacuum deposition, electrolytic polymerization, and CVD, thus expanding the range of usable materials.

EXAMPLE 8

Samples having the structure comprising a lower electrode/an insulating thin film/an insulating thin film/an upper electrode (FIG. 2) were prepared according to the following procedures.

As a pretreatment, a cleaned glass substrate 1 is subjected to ultrasonic treatment for 5 minutes a cleaned glass substrate 1 by use of butyl acetate, and N$_2$ is blown thereon, and then the substrate thus treated is put in a 120° C. oven to carry out baking for 10 minutes. The resulting substrate is spin-coated with hexamethyldisilazane (HMDS) under conditions of 2,500 rpm and 30 seconds, and baking is carried out for 10 minutes in a 200° C. oven. Next, a resist material RD-2000N-10 is spin-coated thereon under conditions of 400 rpm and 1 second for the first coating and 3,000 rpm and 40 seconds for the second coating to give a film thickness of 0.7 μm, and then prebaking is carried out at 80° C. for 25 minutes. Subsequently, exposure to light is carried out under conditions of 3.0 counts using a cold mirror (290 nm) of PLA-520F (produced by Canon Inc.) and under hard contact. Thereafter, development is carried out for 100 seconds using a developing solution for its exclusive use, followed by postbaking at 120° C. for 20 minutes to make a resist pattern.

On the substrate thus treated, Cr was deposited by vacuum deposition with a thickness of 100 Å as an underlayer, and Au was further deposited thereon by the same process (film thickness: 600 Å). The resulting substrate was subjected to ultrasonic treatment using acetone for 5 min., ultrasonic treatment using dimethylformamide (DMF) for 5 min., washing with pure water for 5 min., and N$_2$ blowing, followed by baking for 10 minutes in a 120° C. oven, thus forming a lower electrode 2 with a width of 40 μm by the lift-off process. This substrate was left to stand for 24 hours in a saturated vapor of HMDS to carry out hydrophobic treatment. On the substrate thus treated, a 4-, 6-, 12-, 20-, 24-, 30-, 42-, 60-, 200- or 300-layer built-up film (film thickness: 80 Å) of polyimide monomolecular films was formed by the LB process in the same manner as Example 5, thus providing an insulating thin film 3.

On this substrate, SiO$_2$ is deposited by vacuum deposition with a thickness of 3,000 Å. Next, a resist material AZ-1370 is coated thereon using a spinner under conditions of 500 rpm and 5 seconds for the first coating and 3,000 rpm and 30 seconds for the second coating to give a film thickness of 1.2 μm. This is then subjected to prebaking at 90° C. for 15 minutes, followed by exposure to light under contact for 10 seconds using MA-10, (produced by Mikasa Co.). Next, peeling is carried out under conditions of 15 seconds using a solution of MF312:DI-Water=1:1 and 15 seconds for washing with pure water, N$_2$ is blown, and then postbaking is carried out at 120° C. for 30 minutes. Thereafter, etching is carried out using a solution of HF:NH$_4$F=1:7 to effect patterning of SiO$_2$, thus providing an inorganic oxide layer 4 which protects the step portion of the electrode. The resulting substrate is subjected to ultrasonic treatment using acetone for 5 minutes, ultrasonic treatment using DMF, and blowing of N$_2$, and thereafter baking is carried out for 10 minutes in a 120° C. oven.

On the resulting substrate, Al is deposited by vacuum deposition with a thickness of 1,000 Å. Next, a resist material AZ-1370 is coated thereon using a spinner under conditions of 500 rpm and 5 seconds for the first coating and 3,000 rpm and 30 seconds for the second coating to give a film thickness of 1.2 μm. This is then subjected to prebaking at 90° C. for 15 minutes, followed by exposure to light under contact for 10 seconds using MA-10 (produced by Mikasa Co.). Next, development is carried out under conditions of 15 seconds using a solution of MF312:DI-Water=1:1 and 15 seconds for washing with pure water, N$_2$ is blown, and then postbaking is carried out at 120° C. for 30 minutes.

Thereafter, Al is etched using a solution of H$_3$PO$_4$:HNO$_3$:CH$_3$COOH:H$_2$O=16:1:2:1 to effect patterning. The resulting substrate is subjected to ultrasonic treatment using acetone for 5 minutes, ultrasonic treatment using DMF for 5 minutes, and washing with pure water for 5 minutes to peel the resist, blowing of N$_2$ is carried out, and thereafter baking is carried out for 10 minutes in a 120° C. oven, thus forming an upper electrode 5. The electrode thus formed was made to have a width of 40 μm.

A voltage was applied between the upper and lower electrodes of the samples thus prepared, and current characteristics (VI characteristics) thereby produced were measured. Memory-functional switching characteristics were observed which have been hitherto unknown in other conventional samples (FIG. 4). It was further possible to produce a stable on-state (resistance value: several ten Ω) and off-state (resistance value: not less than M C 106 order Ω) as shown in FIG. 5, where the on-to-off switching showed a constant threshold voltage (about 1 to 2 V/20 layers), the off-to-on switching occurred at about −2 to 2 V, and the switching speed was in the picosecond order with an on/off ratio (ratio of resistance value in the on state and off state) of not less than 5 figures. The threshold voltage was in a tendency to become higher with an increase in the monomolecular film layer number of the insulating layer. As a result, the 4-layer samples and 6-layer samples showed unstable switching characteristics, and the 300-layer samples showed that switching occurred with difficulty. Here, the film thickness per layer of the polyimide monomolecular built-up film measured using ellipsometry was found to be several Å. Also, the repetition stability was evaluated based on the number of the switching times repeated until generation of heat caused destruction of electrodes when triangular waves with a peak value of ±8 V and an alternating electric field frequency of 2 Hz were continuously applied, to find that the repeated switching times were $2 \times 10^7$ times.

EXAMPLE 9

A lower electrode is formed on a substrate by the lift-off process in the same manner as Example 8. A polyimide monomolecular film is also prepared by the LB process in the same manner as Example 8.

On the resulting substrate, Al$_2$O$_3$ is deposited by vacuum deposition with a thickness of 400, 1,000, 2,000 or 4,000 Å or 2 μm. Next, a resist material AZ-1370 is coated thereon using a spinner under conditions of 500 rpm and 5 seconds for the first coating and 3,000 rpm and 30 seconds for the second coating to give a film thickness of 1.2 μm. This is then subjected to prebaking at 90° C. for 50 minutes, followed by exposure to light under contact for 10 seconds using MA-10 (produced by Mikasa Co.). Next, development is carried out under conditions of 15 seconds using a solution of MF312:DI-Water=1:1 and 15 seconds for washing with pure water, N$_2$ is blown, and then postbaking is carried out at 120° C. for 30 minutes. Thereafter, etching is carried out using a solution of HF:NH$_4$F=1:7 to effect patterning of Al$_2$O$_3$, thus providing a protective layer for the portion of the electrode.

On the resulting substrate, the desired upper electrode is formed by photoetching in the same manner as Example 8. The electrode was made to have a width of 20 μm.

The current-voltage characteristics of the samples prepared in the above way were measured in the same manner as Example 8 to find that the same memory-functional switching characteristics as Example 8 were observed. The switching speed was in the picosecond order. Also, the on/off ratio was not less than 5 figures, and the repeated switching times were $1 \times 10^7$ times.

In the instance where the insulating material at the step portion of the electrode had a film thickness of 400 Å, it was unable to sufficiently ensure the insulating properties of the insulating material, and in the instance of 2 μm, step breakage was liable to occur at the upper electrode.

EXAMPLE 10

A cleaned glass plate was subjected to hydrophobic treatment by allowing it to stand for 24 hours in a saturated vapor of HMDS. On the substrate thus treated, Cr was deposited as an underlayer by vacuum deposition with a thickness of 100 Å, and Au was further deposited by the same process (film thickness: 500 Å).

Next, on the resulting substrate, a 24-layer built-up film (film thickness: 96 Å) of polyimide monomolecular films was formed using the LB process to provide an insulating thin film. The polyimide monomolecular built-up film was prepared in the same manner as Example 8.

On the resulting substrate, Al was deposited as an upper electrode by vacuum deposition (film thickness: 1,000 Å). Next, a resist material AZ-1370 is coated thereon using a spinner under conditions of 500 rpm and 5 seconds for the first coating and 3,000 rpm and 30 seconds for the second coating to give a film thickness of 1.2 μm. This is then subjected to prebaking at 90° C. for 15 minutes, followed by exposure to light under contact for 10 seconds using MA-10 (produced by Mikasa Co.). Next, development is carried out under conditions of 15 seconds using a solution of MF312:DI-Water=1:1 and 15 seconds for washing with pure water, $N_2$ is blown, and then postbaking is carried out at 120° C. for 30 minutes. Thereafter, Al is etched using a solution of $H_3PO_4:HNO_3:CH_3COOH:H_2O = 16:1:2:1$ to effect patterning. The resulting substrate is subjected to ultrasonic treatment using acetone for 5 minutes, ultrasonic treatment using DMF for 5 minutes, and washing with pure water for 5 minutes to peel the resist under these conditions, blowing of $N_2$ is carried out, and thereafter baking is carried out for 10 minutes in a 120° C. oven, thus forming an upper electrode with an electrode width of 20 μm.

On the resulting substate, $SiO_2$ is deposited by vacuum deposition with a thickness of 1,000 Å. This is subjected to etching of $SiO_2$ in the same manner as Example 8 to form an opening of the upper electrode. On the resulting substrate, Al is deposited by vacuum deposition with a film thickness of 3,000 Å, followed by the same photoetching as Example 8 to effect patterning of Al, thus providing the desired lead electrode of the upper electrode.

The voltage-current characteristics of the samples prepared in the above way were measured in the same manner as Example 8 to find that the same memory-functional switching characteristics as Example 8 were obtained. The switching speed was in the picosecond order, and the repeated switching times were $1 \times 10^7$ times.

EXAMPLES 11 to 18

Using the electrode materials, insulating materials, insulating materials for protecting electrode step portion as shown in Table 1, devices were fabricated with the same device structure as those of Examples 8 and 9.

The switching characteristics, switching speed and repeated switching times were measured in the same manner as Examples 8 and 9 to obtain the results as shown in Table 1.

TABLE 1

| Example No. | Lower electrode | Upper electrode | Insulating material (layer number) | Insulating material for protecting electorode step portion | LB film forming conditions | Appearance of switching characteristics | Electrode width (μm) | Switching speed | Repetition stability (times) |
| --- | --- | --- | --- | --- | --- | --- | --- | --- | --- |
| 11 | Cr/Au (100Å/500Å) | Al (1,000Å) | Polyimide (24) | $SiO_2$ (1,000Å) | The same as Example 8 | Appeared | 40 | Picosec. order | $1 \times 10^7$ |
| 12 | Cr/Au (100Å/500Å) | Al (1,000Å) | Polyimide (24) | $SiO_2$ (1,000Å) | The same as Example 8 | Appeared | 20 | Picosec. order | $1 \times 10^7$ |
| 13 | Cr/Au (100Å/500Å) | Al (1,000Å) | Polyimide (24) | $SiO_2$ (3,000Å) | The same as Example 8 | Appeared | 20 | Picosec. order | $2 \times 10^7$ |
| 14 | Cr/Au (100Å/500Å) | Al (1,000Å) | Polyimide (30) | $SiO_2$ (3,000Å) | The same as Example 8 | Appeared | 40 | Picosec. order | $2 \times 10^7$ |
| 15 | Pt (100Å) | Al (1,000Å) | Polyimide (24) | $SiO_2$ (1,000Å) | The same as Example 8 | Appeared | 20 | Picosec. order | $9 \times 10^6$ |
| 16 | Pt (100Å) | Al (3,000Å) | Polyimide (30) | $Al_2O_3$ (1,000Å) | The same as Example 8 | Appeared | 20 | Picosec. order | $9 \times 10^6$ |
| 17 | Pt (100Å) | Al (3,000Å) | Polyimide (24) | $Al_2O_3$ (2,000Å) | The same as Example 8 | Appeared | 40 | Picosec. order | $1 \times 10^7$ |
| 18 | Pt (100Å) | Al (1,000Å) | Polymide (20) | $Al_2O_3$ (2,000Å) | The same as Example 8 | Appeared | 20 | Picosec. order | $8 \times 10^6$ |

COMPARATIVE EXAMPLE 1

A lower electrode was formed and a 20-layer polyimide monomolecular built-up film was formed in the same manner as Example 8. Thereafter an upper electrode was formed without protecting the step portion of the electrode. A voltage was applied between the upper and lower electrode of the samples thus prepared, and the current characteristics thereby produced were measured to find that the same memory-functional switching characteristics as Example 8 were observed. However, when compared with the above Examples, the samples showed lower repetition stability, which was $2 \times 10^6$ times.

COMPARATIVE EXAMPLE 2

Devices were fabricated in the same manner as Example 8. Here, the electrodes were made to be 150 μm and 1 mm in width. Such electrode widths correspond to the size formed according conventional vapor deposition methods using masks.

The current-voltage characteristics of the devices thus obtained were measured, to find that the same memory-functional switching characteristics as Example 8 were obtained but the switching speed was 30 nanoseconds and 700 nanoseconds, respectively.

The present invention effects the following:

(i) In the MIM structure device in which the insulating layer is formed of a thin film comprising an inorganic oxide layer laminated on an organic insulating layer, the memory-functional switching characteristics are obtained, which have not seen in conventional devices.

(ii) As compared with the instances in which the inorganic oxide layer is not provided in the insulating layer of such MIM devices, great improvements are seen in the repeated switching times and storage stability of devices.

(iii) Protecting the step portion of the lower electrode by providing the insulating layer after build-up of LB films can bring about improvements in the repetition stability of the switching characteristics of MIM devices.

(iv) The lithographic technique is used in the process of forming the electrodes of the MIM devices in which the polymeric compounds having excellent thermal resistance and solvent resistance are built up by the LB process to form the insulating layer, so that it has become possible to make the electrodes finer and more highly dense.

(v) The electrodes can be made finer by using the lithographic technique in the process of forming the electrodes of the MIM devices in which the polymeric compounds having excellent thermal resistance and solvent resistance are built up by the LB process to form the insulating layer, so that it has become possible to make the switching speed higher.

We claim:

1. A switching device, comprising first and second electrodes, an organic insulating layer having a thickness of 3 Å to 1000 Å and an inorganic oxide layer having a thickness of at most 200 Å, wherein said organic insulating layer and said inorganic oxide layer are disposed adjacent to each other, wherein said first electrode is disposed adjacent to said organic insulating layer, wherein said second electrode is disposed adjacent to said inorganic oxide layer and wherein said first electrode comprises a material selected from the group consisting of a noble metal and an oxide conductive material.

2. The switching device according to claim 1, wherein said organic insulating layer is comprised of an organic compound having at least one $\pi$-electron level.

3. The switching device according to claim 1, wherein said organic insulating layer has a thickness of not less than 50 Å and not more than 300 Å.

4. The switching device according to claim 1, wherein said organic insulating layer comprises a monomolecular film.

5. The switching device according to claim 1, wherein said inorganic oxide layer is comprised of a metal oxide.

6. The switching device according to claim 1, wherein said inorganic oxide layer has a thickness of at most 50 Å.

7. A switching device, comprising first and second electrodes, an organic insulating thin film having a step portion and an inorganic insulating thin film, said organic insulation thin film and said inorganic insulating thin film being provided between said first and second electrodes, said organic insulating thin film having a thickness of 20 Å to 1000 Å, and said inorganic insulating thin film being provided on said step portion of said organic insulating thin film, wherein said first electrode is disposed adjacent to said organic insulating thin film and wherein said first electrode comprises a material selected from the group consisting of a noble metal and an oxide conductive material.

8. The switching device according to claim 7, wherein said organic insulating thin film comprises a polyimide obtained by cyclic polymerization of a polyamic acid, a polyamic acid salt or a polyamic acid ester.

9. The switching device according to claim 7, wherein said inorganic insulating thin film has a thickness ranging between 500 Å and 1 μm.

10. A switching device according to claim 2, wherein said organic compound is a material selected from the group of consisting of coloring materials having a porphirin structure, azulene dyes having a squarilium group and a croconic methine group as bonding chains, cyanine-analogus dyes formed by combining two nitrogen-containing heterocyclic rings, cyanine dyes, condensed polycyclic aromatics, derivatives of tetraquinodimethane, derivatives of tetrathiafulvalene and metal complex compounds.

11. A switching device according to claim 2, wherein said organic compound is a material selected from the group consisting of polyimide, polystyrene, polydiacetylene and polythiophene.

12. A switching device according to claim 4, wherein said organic insulating layer comprises a Langmuir-Blodgett film.

13. A switching device according to claim 5, wherein said inorganic oxide is a material selected from the group consisting of $Al_2O_3$, BaO, BeO, MgO, $SiO_2$, CuO, PbO, $Fe_2O_3$, $Cu_2O$, $V_2O_5$, $Ta_2O_5$, $TiO_2$, $WO_3$, $Ag_2O$ and $PbTiO_3$.

14. A switching device according to claim 1 or 7, wherein said first electrode comprises a material selected from the group consisting of Au, Pt, Ag, Pd, Al, In, Sn, Pb, graphite, silicide and conductive oxides.

15. A switching device according to claim 7, wherein said inorganic insulating thin film has a thickness ranging between 1000 Å to 3000 Å.

16. A switching device according to claim 7, wherein said organic insulating thin film comprises a monomolecular film.

17. A switching device according to claim 16, wherein said organic insulating thin film comprises a Langmuir-Blodgett film.

18. A switching device according to claim 7, wherein said inorganic insulating thin film comprises an inorganic oxide.

19. A switching device according to claim 18, wherein said inorganic oxide comprises a material selected from the group of consisting of $Al_2O_3$, BaO, BeO, MgO, $SiO_2$, CuO, PbO, $Fe_2O_3$, $Cu_2O$, $V_2O_5$, $Ta_2O_5$, $TiO_2$, $WO_3$, $Ag_2O$ and $PbTiO_3$.

20. The switching device according to claim 1, wherein said organic insulating layer comprises a built-up film having plural monomolecular films.

21. A switching device according to claim 7, wherein said organic insulating thin film comprises a built-up film having plural monomolecular films.

* * * * *

UNITED STATES PATENT AND TRADEMARK OFFICE
CERTIFICATE OF CORRECTION

PATENT NO. : 5,075,738
DATED : December 24, 1991
INVENTOR(S) : HIROSHI MATSUDA, ET AL.

It is certified that error appears in the above-identified patent and that said Letters Patent is hereby corrected as shown below:

Title page,

IN [56] REFERENCES CITED

Under U.S. PATENT DOCUMENTS, "Wakayashi et al." should read --Wakabayashi et al.--.

IN [57] ABSTRACT

Line 10, "than" should read --that--.

COLUMN 1

Line 36, "device" should read --devices--.
Line 42, "can not" should read --cannot--.

COLUMN 2

Line 26, "(Langmuir-Blodgette)" should read --(Langmuir-Blodgett)--.
Line 49, "FIG. 1" should read --FIG. 1,--.
Line 54, "a" should be deleted.

COLUMN 3

Line 10, "squalilium" should read --squarilium--.
Line 11, "cyanine-analogus" should read --cyanine-analogous--.
Line 14, "squalilium" should read --squarilium--.
Line 37, insert --Formula (1)--.

UNITED STATES PATENT AND TRADEMARK OFFICE
CERTIFICATE OF CORRECTION

PATENT NO. : 5,075,738
DATED : December 24, 1991
INVENTOR(S) : HIROSHI MATSUDA, ET AL.

It is certified that error appears in the above-identified patent and that said Letters Patent is hereby corrected as shown below:

COLUMN 4

Line 57, "the" should be deleted.

COLUMN 5

Line 16, "(i,e," should read --(i.e.,--.

COLUMN 6

Line 35, "employs" should read --employ--.

COLUMN 7

Line 14, "a" should read --an--.
Line 19, "squalilium" should read --squarilium--.

COLUMN 8

Line 3, "a" should read --an--.
Line 43, "was" should read --were--.

COLUMN 9

Line 26, "and thereafter" should be deleted.

COLUMN 10

Line 1, "and thereafter" should read --after--.
Line 49, "and thereafter" should read --after--.

UNITED STATES PATENT AND TRADEMARK OFFICE
CERTIFICATE OF CORRECTION

PATENT NO. : 5,075,738
DATED : December 24, 1991
INVENTOR(S) : HIROSHI MATSUDA, ET AL.

It is certified that error appears in the above-identified patent and that said Letters Patent is hereby corrected as shown below:

COLUMN 11

Line 25, "25 mN/m.," should read --25 mN/m,--.
Line 60, "and even" should read --after which--.

COLUMN 12

Line 15, "and even" should read --after which--.
Line 16, "thereafter" should be deleted.
Line 30, "107" should read --$10^7$--.
Line 54, "and thereafter" should read --after which--.

COLUMN 13

Line 1, "substrate 1" should read --substrate 1, cleaned by use of butyl acetate--.
Line 2, "a cleaned" should be deleted.
Line 3, "glass substrate 1 by use of butyl acetate," should be deleted.
Line 27, "water-" should read --water--.
Line 45, "MA-10," should read --MA-10--.

COLUMN 16

Line 23, "insulating materials," should be deleted.
TABLE 1, "electorode" should read --electrode--.
Line 62, "electrode" should read --electrodes--.

UNITED STATES PATENT AND TRADEMARK OFFICE
CERTIFICATE OF CORRECTION

PATENT NO. : 5,075,738

DATED : December 24, 1991

INVENTOR(S) : HIROSHI MATSUDA, ET AL.

It is certified that error appears in the above-identified patent and that said Letters Patent is hereby corrected as shown below:

COLUMN 18

Line 4, "insulation" should read --insulating--.
Line 26, "cyanine-analogus" should read
--cyanine-analogous--.

Signed and Sealed this

Twenty-second Day of June, 1993

Attest:

MICHAEL K. KIRK

Attesting Officer     Acting Commissioner of Patents and Trademarks